(12) United States Patent
Dommer

(10) Patent No.: US 8,796,928 B2
(45) Date of Patent: Aug. 5, 2014

(54) RESONATOR CONFIGURATION FOR MICROWAVE GENERATOR

(71) Applicant: Diehl BGT Defence GmbH & Co. KG, Überlingen (DE)

(72) Inventor: Josef Dommer, Nuremberg (DE)

(73) Assignee: Diehl BGT Defence GmbH & Co. KG, Ueberlingen (DE)

( * ) Notice: Subject to any disclaimer, the term of this patent is extended or adjusted under 35 U.S.C. 154(b) by 56 days.

(21) Appl. No.: 13/690,711

(22) Filed: Nov. 30, 2012

(65) Prior Publication Data

US 2013/0140985 A1 Jun. 6, 2013

(30) Foreign Application Priority Data

Dec. 3, 2011 (DE) .......................... 10 2011 120 290

(51) Int. Cl.
*H01J 25/50* (2006.01)

(52) U.S. Cl.
USPC ....................................................... 315/39.61

(58) Field of Classification Search
USPC .................................................. 315/39, 39.61
See application file for complete search history.

(56) References Cited

U.S. PATENT DOCUMENTS

| 2,240,941 | A | 5/1941 | Ohl |
| 4,175,277 | A | 11/1979 | Zuk |
| 7,233,084 | B2 | 6/2007 | Dommer et al. |
| 2003/0076044 | A1 | 4/2003 | Staines et al. |
| 2008/0036549 | A1* | 2/2008 | Stark et al. ..................... 331/127 |

FOREIGN PATENT DOCUMENTS

| DE | 10151565 A1 | 5/2003 |
| DE | 10313286 B3 | 1/2005 |
| GB | 726266 | 3/1955 |
| WO | 2010098699 A1 | 9/2010 |

* cited by examiner

*Primary Examiner* — Don Le
(74) *Attorney, Agent, or Firm* — Laurence A. Greenberg; Werner H. Stemer; Ralph E. Locher

(57) ABSTRACT

In order to increase a service life of a microwave generator, a resonator configuration for a microwave generator has a hollow cylindrical electrical conductor positioned inside a housing, a first electrode, and a second electrode. Two electrodes are spaced apart from one another and form a spark gap in the region of the conductor. A contact element is provided for making electrical contact between the conductor and the first electrode. The position of the first electrode can be adjusted to modify a length of the spark gap. Furthermore, the contact element is electrically connected to the first electrode or its holder so as to resist movement so that the opposing contact surfaces remain in contact even when the position of the first electrode is adjusted with respect to the second electrode. The contact element is configured to be deformable, preferably elastically deformable, for this purpose.

15 Claims, 3 Drawing Sheets

RESONATOR CONFIGURATION FOR MICROWAVE GENERATOR

CROSS-REFERENCE TO RELATED APPLICATION

This application claims the priority, under 35 U.S.C. §119, of German application DE 10 2011 120 290.4, filed Dec. 3, 2011; the prior application is herewith incorporated by reference in its entirety.

BACKGROUND OF THE INVENTION

Field of the Invention

The present invention relates to a resonator configuration for a microwave generator. The present invention also relates to a microwave generator which has a corresponding configuration.

The function of a microwave generator is based on the fact that a high-voltage battery, for example a capacitor battery, which is charged in parallel and then connected in series in accordance with the principle of the Marx impulse voltage circuit, is discharged via a spark gap which is set up between the electrodes across which the high voltage of the series circuit is then present. Such a discharge process leads to the onset of a steep and highly oscillatory current flow in the electrodes and in antenna-like conductors which are additionally electrically conductively connected thereto and therefore to a corresponding wide-band radiation of a microwave spectrum of high energy density. This can have an adverse effect on radio communications and interfere with or even damage the input to electronic circuits in the vicinity of such a microwave generator.

The service life of a microwave generator is determined mainly by the wear on the electrodes. To increase the service life, recourse has been made to resetting the width of the spark gap by the use of adjustable electrodes. In operation a high voltage of several 100 kV is fed to a moving electrode.

A configuration for supplying high voltage for a microwave generator is disclosed in published, non-prosecuted German patent application DE 101 51 565 A1, corresponding to U.S. Pat. No. 6,822,394. The microwave generator contains an electrode which is rounded off in the shape of a mushroom and is adjustable by a spindle. The spindle is connected to a contact element in the form of a radial bridge with a hollow cylindrical electrical conductor which acts as a radiating antenna. In this design, in order to make an electrical contact, the inner surface of the axial through-hole of the radial bridge touches the outer peripheral surface of the spindle which carries the first electrode. When current flows from the high voltage, sparking, which leads to an erosion of material and therefore in the long term to damage, occurs across these metal contact surfaces due to the increased contact resistance. If a microwave generator is operated under insulating gas, particularly chemically aggressive reaction products, which lead to additional oxidation and therefore to a further degradation of the contact material, are produced during the spark discharge. The eroded material resulting from the electrode wear is deposited on the surfaces and therefore increases the contact resistance, so that the adjustable electrode contact can quickly be destroyed.

SUMMARY OF THE INVENTION

It is accordingly an object of the invention to provide a resonator configuration for a microwave generator which overcomes the above-mentioned disadvantages of the prior art devices of this general type, by which the service life of the microwave generator is increased. A microwave generator with an increased service life is also to be provided.

With the foregoing and other objects in view there is provided, in accordance with the invention a resonator configuration for a microwave generator. The resonator configuration contains a housing, a hollow cylindrical electrical conductor positioned inside the housing, a first electrode, and a second electrode. The first and second electrodes are spaced apart from one another and form a spark gap in a region of the conductor. A contact element is provided for making electrical contact between the conductor and the first electrode. A position of the first electrode is adjusted to modify a length of the spark gap. A holder is provided for holding the first electrode. The contact element has at least one contact region connected to one of the first electrode or the holder so as to resist movement. The contact element is deformable so that opposing contact surfaces of the conductor and the first electrode remain in electrical contact even when a position of the first electrode is adjusted with respect to the second electrode.

Here it must be emphasized that the contact element is connected to the electrode or its holder so as to resist movement so that the opposite contact surfaces remain the same, even when the position of the first electrode is changed with respect to the second electrode, and the contact element is deformable. Because the contact element is deformable, it can be achieved that, when the spark gap is adjusted, the contact surfaces rest against one another unchanged in spite of a change in the position of the first electrode. The invention therefore enables a fixed, permanent electrical connection of the contact element to the first electrode or its holder to be provided. A fixed, permanent electrical connection can also be provided towards the hollow cylindrical electrical conductor. As a result of the movement-resistant electrical contact between the contact element and the electrode or its holder, or between the contact element and the resonator, erosion caused by the spark is avoided and therefore a significant increase in the service life is achieved. If the distance of the first electrode from the second electrode has to be adjusted, stresses caused by the deformability of the contact element, which would normally occur with a non-deformable contact element, are compensated for by the deformable contact element. In contrast with the prior art, it is not necessary for the contact surfaces between the contact element and the first electrode or its holder, or between the first electrode and the resonator, to change when the first electrode is adjusted with respect to the second.

Expediently, the contact element is one which is elastically deformable, so that stresses which normally occur when the position of the first electrode changes are compensated for by the elasticity of the contact element while maintaining the movement-resistant connection of contact element to electrode or to its holder or to the resonator.

Alternatively, the contact element can also be plastically deformable.

According to an expedient embodiment of the invention, the contact element contains an annular inner contact region, which is provided for making contact with the first electrode or its holder, an annular outer contact region, which is provided for making contact with an outer hollow cylindrical electrical conductor which encompasses the two electrodes, and an intermediate region, which contains a plurality of deformation sections or spring elements and apertures which are preferably arranged alternately and preferably in an alternating annular configuration.

Here, the contact element is constructed in the form of a ring, the planar positions of the outer contact region and the inner contact region of which can be changed with respect to one another by deforming the contact element.

It is advantageous when the deformation sections or spring elements project above an imaginary connecting line between the inner contact region and the outer contact region. A contact element formed in this way enables an effective electrical contact to be made to the first electrode with relatively low radial projection, which enables the design of the resonator to be kept small.

Because the region between the outer and inner contact region has a plurality of apertures, pressure surges in the resonator or microwave generator, which occur with every spark discharge, are virtually unimpeded. As a result, the component is not subjected to any or, if at all, then only to small pressure differences, as a result of which the risk of oscillation can be reduced and the life increased.

Advantageously, the spring elements can be in the form of a wave, for example in the form of a substantially U-shaped wave, or in the form of an angle or V-shaped. Here, the conductor length and therefore the inductance is small compared with the required adjustment distance of the spark gap (which is usually 2 to 3 mm), as a result of which the electrical characteristics of the resonator, such as the frequency for example, are not or are only slightly affected. Because of this design, it is possible to maintain smaller dimensions of the resonator, as a result of which it is easier to generate higher frequencies.

Expediently, the inner and outer contact region and the spring elements can have an identical material thickness. In this case, the contact element can easily be punched out of a flat starting material, e.g. sheet steel, and subsequently shaped accordingly.

Alternatively, the respective spring element can also be connected, e.g. welded, to the inner and outer ring during manufacture if, for example, different material thicknesses are preferred.

Instead of spring elements in the form of a strip, spring elements in the form of wire are also suitable. These have the advantage of a let-through area which is as large as possible.

Preferably, the contact element is clamped in order to make a movement-resistant electrical contact with the first electrode and/or its holder. This can prevent sparking. For example, the circumferential inner edge of the contact element can be inserted between the first electrode and its holder and clamped by a screw fixing for this purpose.

In addition, a gap can be provided here, in which the circumferential inner edge of the contact element engages in order to clamp it.

Alternatively, the contact element can also be formed in one piece with the first electrode or its holder or in one piece with the hollow cylindrical electrical conductor.

Other features which are considered as characteristic for the invention are set forth in the appended claims.

Although the invention is illustrated and described herein as embodied in a resonator configuration for a microwave generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
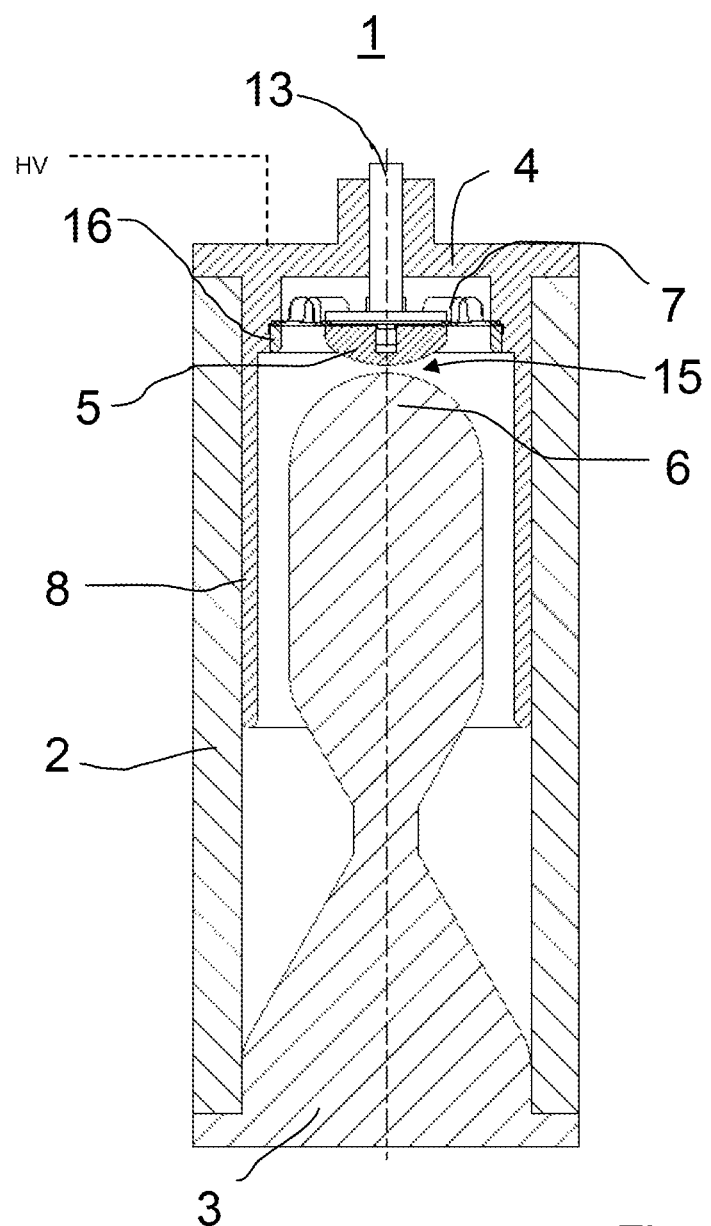
FIG. 1 is a diagrammatic, sectional view in principle along a longitudinal axis of a microwave generator with a configuration of an exemplary embodiment according to the invention.

The reference number 1 designates an expedient embodiment of a microwave generator for a high-voltage spark gap according to the present invention. It contains a cylindrical, electrically insulating housing 2, which is enclosed on the underside by a first housing cover 3, and, on its top side, by a second housing cover 4, which, in the exemplary embodiment, is electrically conducting. Inside the housing 2 are two opposing electrodes 5, 6. The inner (second) electrode 6 is formed substantially in the shape of a club with a central cylindrical section of constant diameter.

The opposing (first) electrode 5 is smaller and formed in the shape of a cap. It is supported by a holder 13 which has a rod-shaped part and an end plate which is fixed to the face thereof.

The gap which is located between the first electrode 5 and the second electrode 6 constitutes a spark gap 15. The spark gap 15 can be changed by axial displacement of the position of the first electrode 5, so that the spark gap 15 can be readjusted as required by axial displacement of the first electrode 5. A non-illustrated adjustment motor can be connected to the holder 13 of the first electrode for this purpose. The first electrode 5 and the second electrode 6 are encompassed in the form of a ring by a hollow cylindrical electrical conductor 8, which at the same time is electrically connected to the first electrode 5 by a contact element 7. The conductor 8 merges in one piece with the first housing cover 4. The latter is connected to a high-voltage source (HV). This is a normal impulse voltage circuit of the kind disclosed, for example, in published, non-illustrated German patent application DE 101 51 565 A1.

The electrodes 5, 6 and the parts which are electrically connected thereto form a capacitor in which high-voltage energy is stored until a sudden discharge of energy occurs as a consequence of a spark flashover along the spark gap 15. Powerfully radiating current oscillations with a steep rising current edge occur as a result of the triggering of the spark gap 15. Together with the hollow cylindrical electrical conductor 8, the electrodes 5, 6 form a resonator (antenna), by which a high-frequency microwave pulse can be radiated.

According to the invention, a contact element 7 is electrically connected both to the hollow cylindrical electrical conductor 8 and to the first electrode 5 so as to resist movement. Here, connected so as to resist movement means that the connection with the respective adjacent component is retained without changing the contact surfaces even when the position of the first electrode 5 with respect to the position of the second electrode 6 has to be changed for the purpose of readjusting the spark gap 15. A position change of this kind is made possible, as the contact element 7 is configured as a deformable contact element. When the position of the first electrode 5 changes, comparable stresses which occur with a rigid contact element are compensated for due to the deformable contact element 7 of the present invention.

The contact resistance is low and the material erosion due to sparking is effectively suppressed due to the provision of a movement-resistant electrical connection of the contact element 7 to the adjacent components.

It is particularly advantageous when the contact element 7 is in the form of an elastically deformable contact element. The contact element 7 is made of electrically conducting material, e.g. a steel sheet or similar.

Figure 2A:
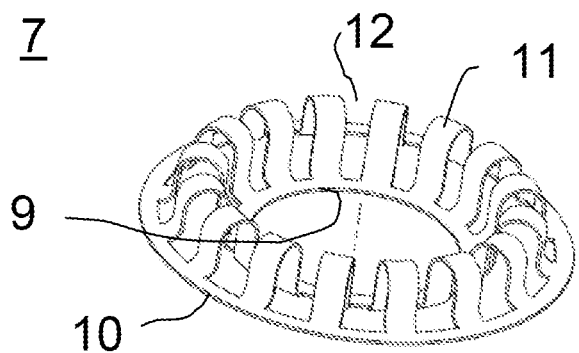
FIGS. 2A-2C are perspective views of different embodiments of deformable contact elements according to the invention.
Figure 2B:
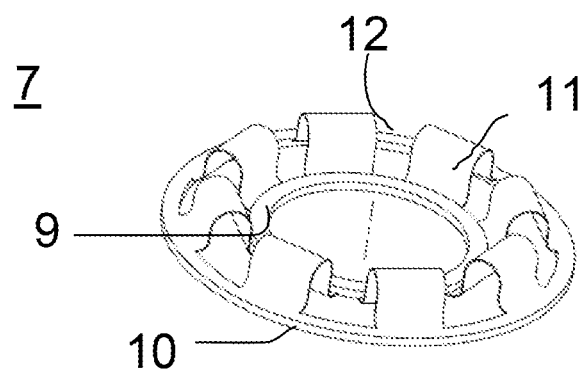
Figure 2C:
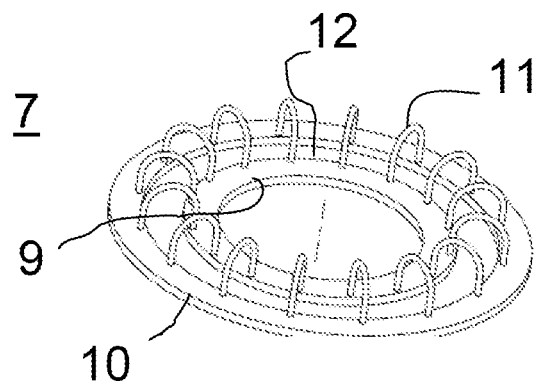

FIGS. 2A to 2C show different embodiments of such an elastically deformable contact element 7.

A common feature of all embodiments is that an inner annular contact region 9 and an outer annular contact region 10 are provided. The contact regions 9, 10 are used to cater for the movement-resistant electrical connection with the respective adjacent component.

Another common feature of all embodiments is that individual spring elements 11, which effect the elastic deformability, and apertures 12 are alternately arranged side-by-side along the circumference of the respective annular contact element 7, thus enabling, on the one hand, a radial symmetrical flow of current over the whole surface of the contact element 7 by the spring elements 11 and, on the other, providing an open design due to the apertures 12. This has the advantage that the pressure surges in the resonator due to the spark discharge are not or are not substantially impeded by the contact element 7. This in turn results in no or only insignificant mechanical pressure loadings due to pressure differences, as a result of which an excitation leading to oscillation can be reduced and the life of the microwave generator can be increased.

The individual spring elements 11 have a substantially U-shaped form and consequently project above an imaginary connecting plane between the inner contact region 9 and the outer contact region 10. On the one hand, this enables the risk of flashover to be kept small. On the other, the cable length and therefore the inductance is small compared with the adjustment distance of the first electrode 5 (usually 2 to 3 mm), as a result of which, advantageously, the electrical characteristics of the resonator, such as its frequency for example, are not or are only insignificantly affected.

In the representation of the embodiment of the contact element 7 according to FIG. 2A, the contact element 7 is a contact element which is manufactured, for example by stamping, from a flat starting material (e.g. sheet steel) and subsequently shaped to form the U-shaped spring elements 11. The contact element 7 consequently has a constant material thickness over its whole area. The spring elements 11 are in the form of a strip.

In the embodiment of the contact element 7 according to FIG. 2B, the material thickness in the region of the spring elements 11 is less than in the inner contact region 9 and the outer contact region 10. Here, the spring elements 11 have consequently been retrospectively connected to the inner contact region 9 and the outer contact region 10. The spring elements 11 are likewise in the form of a strip.

In the embodiment according to FIG. 2C, in each case a U-shaped spring element 11 in the form of a wire is provided instead of spring elements in the form of a strip. This embodiment forms a particularly large total let-through cross section.

A common feature of all embodiments is that, due to the shape, an elastic deformation of the spring elements 11 is possible and, in addition, a comparatively narrow contact element 7 can be realized, with the consequence that the spacing of the first electrode 5 or its holder 13 from the hollow cylindrical electrical conductor 8 remains small and consequently a resonator with small dimensions can be realized. Once again, high frequencies can be generated due to the small dimensions of the resonator. The open design resulting from the individual apertures 12 enables dust, which is produced at the electrode as wear during the spark discharge, to be removed from the region of the electrodes, i.e. spark discharge, thus enabling the life of the microwave generator to be increased.

Figure 3:
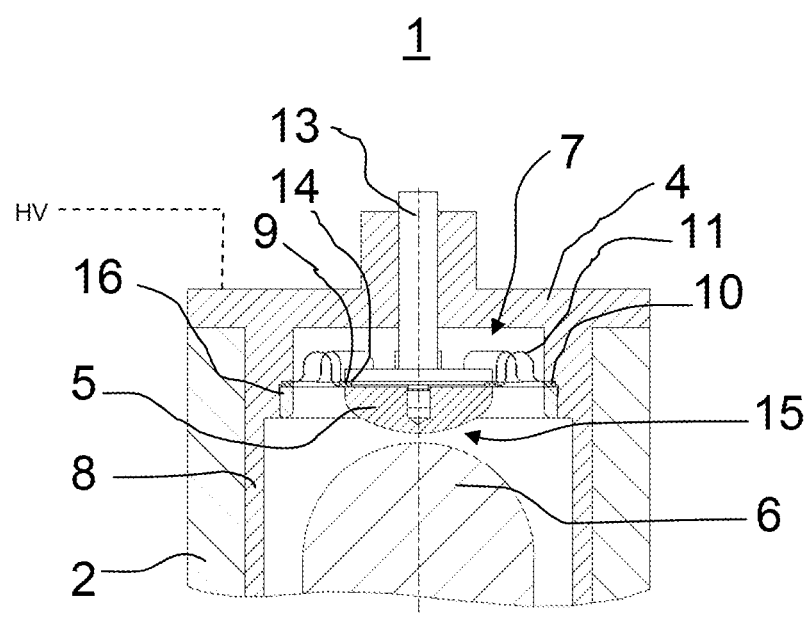
FIG. 3 is a diagrammatic, sectional view of that region of the microwave generator shown in FIG. 1 in which a spark gap is located.

As shown in FIG. 3, in order to guarantee a movement-resistant connection of the contact element 7, the inner contact region 9 is securely clamped (by a screw fixing which is not shown) within a gap 14 between the flat rear side of the first electrode 5 and the opposing end plate of the holder 13. On the opposing side, the outer contact region 10 is clamped between the second housing cover 4 and a threaded ring 16 so that the contact element 7 is held on both sides so as to resist movement.

If the position of the electrode 5 is now changed, then the contact element 7 undergoes a deformation in the region of its spring elements 11 which can be compared with a rolling process. The respective contact surfaces on the contact element 7 remain unchanged thereby.

Other types of connection are also suitable for producing a movement-resistant connection as long as they allow an electrical contact to be made. For example, welding, soldering, riveting or even gluing is conceivable. The important thing is that measures are taken to guarantee an electrical contact.

The contact elements 7 shown in FIG. 2A to 2C comprise the spring elements 11 which enable an elastic deformation to take place. Alternatively, spring elements which entail a plastic deformation can also be provided.

Instead of connecting the contact element 7 to the first electrode 5 or its holder 13, as an alternative, it is also possible to provide the contact element on the first electrode 5 or on its holder 13 as an integral part of a one-piece component. This also applies as an alternative or in combination therewith for the opposing component in the form of the hollow cylindrical electrical conductor 8 or the housing cover 4 which is in one piece therewith.

The present invention enables the occurrence of sparking in the region of the first electrode to be effectively prevented and results in a significant increase in the service life of a microwave generator as a consequence thereof.

List of References
1 Microwave generator
2 Housing
3 First housing cover
4 Second housing cover
5 First electrode
6 Second electrode
7 Contact element
8 Hollow cylindrical electrical conductor
9 Inner contact region
10 Outer contact region
11 Spring element
12 Aperture
13 Holder (first electrode)
14 Gap
15 Spark gap
16 Threaded ring

The invention claimed is:

1. A resonator configuration for a microwave generator, comprising:
 a housing;
 a hollow cylindrical electrical conductor positioned inside said housing;
 a first electrode;

a second electrode, said first and second electrodes being spaced apart from one another and form a spark gap in a region of said conductor;

a contact element for making electrical contact between said conductor and said first electrode;

a position of said first electrode being adjusted to modify a length of said spark gap;

a holder for holding said first electrode; and said contact element having at least one contact region connected to one of said first electrode or said holder so as to resist movement, and said contact element being deformable so that opposing contact surfaces of said conductor and said first electrode remain in electrical contact even when a position of said first electrode is adjusted with respect to said second electrode.

2. The configuration according to claim 1, wherein said contact element has at least one further contact region connected to said conductor so as to resist movement.

3. The configuration according to claim 1, wherein said contact element is elastically deformable.

4. The configuration according to claim 1, wherein said contact element is plastically deformable.

5. The configuration according to claim 1, wherein said contact element includes:

said contact region being an inner contact region for making electrical contact with one of said first electrode or said holder;

an outer contact region for making electrical contact with said conductor; and an intermediate region having a plurality of deformation sections and apertures formed therein.

6. The configuration according to claim 5, wherein said deformation sections are spring elements.

7. The configuration according to claim 5, wherein said deformation sections project above an imaginary connecting plane between said inner contact region and said outer contact region.

8. The configuration according to claim 5, wherein said deformation sections are in a form of a wave or an angle.

9. The configuration according to claim 5, wherein said inner contact region, said outer contact region and said deformation sections have identical material thicknesses.

10. The configuration according to claim 5, wherein said deformation sections are in a form of a strip or a wire.

11. The configuration according to claim 1, further comprising a connection selected from the group consisting of a clamp connection, a screw connection, a welded connection, a solder connection and an electrically conducting glued connection to produce a movement-resistant electrical connection.

12. The configuration according to claim 11, wherein said first electrode and said holder define a gap there-between, and said contact element engages in said gap.

13. The configuration according to claim 1, wherein said contact element is formed in one piece with one said first electrode or said holder.

14. The configuration according to claim 1, wherein said contact element is formed in one piece with said conductor.

15. A microwave generator, comprising:

an impulse voltage circuit; and a resonator configuration, containing:

a housing;

a hollow cylindrical electrical conductor positioned inside said housing;

a first electrode;

a second electrode, said first and second electrodes being spaced art from one another and form a spark gap in a region of said conductor;

a contact element for making electrical contact between said conductor and said first electrode;

a position of said first electrode being adjusted to modify a length of said spark gap;

a holder for holding said first electrode; and said contact element having at least one contact region connected to one of said first electrode or said holder so as to resist movement, said contact element being deformable so that opposing contact surfaces of said conductor and said first electrode remain in electrical contact even when a position of said first electrode is adjusted with respect to said second electrode.

* * * * *